(12) United States Patent
Soumi

(10) Patent No.: US 8,308,382 B2
(45) Date of Patent: Nov. 13, 2012

(54) OPERATION APPARATUS AND ELECTRONIC DEVICE EQUIPPED THEREWITH

(75) Inventor: Mitsuo Soumi, Miyagi (JP)

(73) Assignee: FUJIFILM Corporation, Tokyo (JP)

( * ) Notice: Subject to any disclaimer, the term of this patent is extended or adjusted under 35 U.S.C. 154(b) by 922 days.

(21) Appl. No.: 12/361,326

(22) Filed: Jan. 28, 2009

(65) Prior Publication Data

US 2009/0194343 A1 Aug. 6, 2009

(30) Foreign Application Priority Data

Jan. 31, 2008 (JP) ................................. 2008-020729

(51) Int. Cl.
*B41J 5/00* (2006.01)
(52) U.S. Cl. .......................... 400/478; 400/472; 400/477
(58) Field of Classification Search ............... 178/18.01, 178/18.03; 400/472, 477, 478, 483, 488
See application file for complete search history.

(56) References Cited

U.S. PATENT DOCUMENTS

| | | | | |
|---|---|---|---|---|
| 7,119,796 B2 * | 10/2006 | Van Dam et al. | ............. | 345/173 |
| 7,876,199 B2 * | 1/2011 | Caine | ......................... | 340/407.2 |
| 2009/0250267 A1 * | 10/2009 | Heubel et al. | ............. | 178/18.03 |

FOREIGN PATENT DOCUMENTS

| | | |
|---|---|---|
| JP | 10-240250 A | 9/1998 |
| JP | 2002-169653 A | 6/2002 |
| JP | 2002-278694 A | 9/2002 |
| JP | 2006-268665 A | 10/2006 |
| JP | 2007-087764 A | 4/2007 |
| WO | 2007/099728 A1 | 9/2007 |

OTHER PUBLICATIONS

Notice of Reasons for Rejection, dated Oct. 25, 2011, issued in corresponding JP Application No. 2008-020729, 4 pages in English and Japanese.
Notification of the First Office Action, dated Apr. 28, 2012, issued in corresponding CN Application No. 200910006002.0, 13 pages in English and Chinese.

* cited by examiner

*Primary Examiner* — My-Chau T Tran
(74) *Attorney, Agent, or Firm* — Sughrue Mion, PLLC

(57) ABSTRACT

An operation apparatus that enables selection of a required menu item from a plurality of menu items without several pushes of operation keys, and an electronic device that is equipped with the operation apparatus. When a fingertip is moved while protrusion portions of an operation apparatus are being touched with the fingertip, this is detected by an electrostatic capacitance-type sensor, and a selection frame for selecting a menu item is moved horizontally/vertically. Then, when the selection frame reaches a required menu item, the menu item is selected. Thus, it is possible to select a required menu item from a plurality of menu items just by moving a finger while touching the protrusion portion, without several pushes of operation keys.

15 Claims, 17 Drawing Sheets

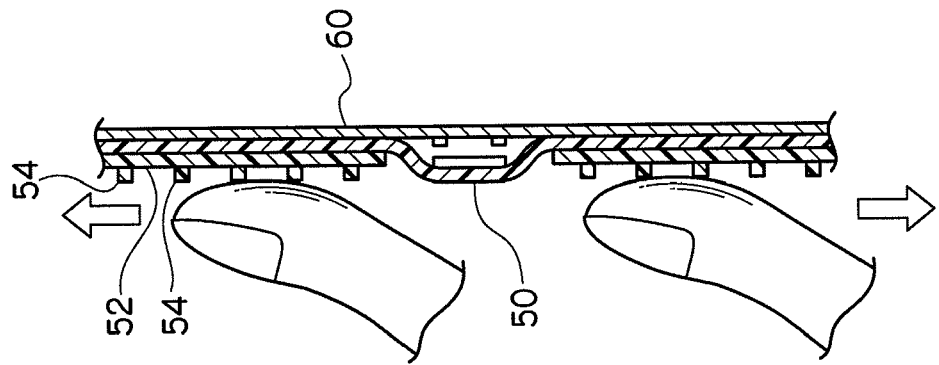
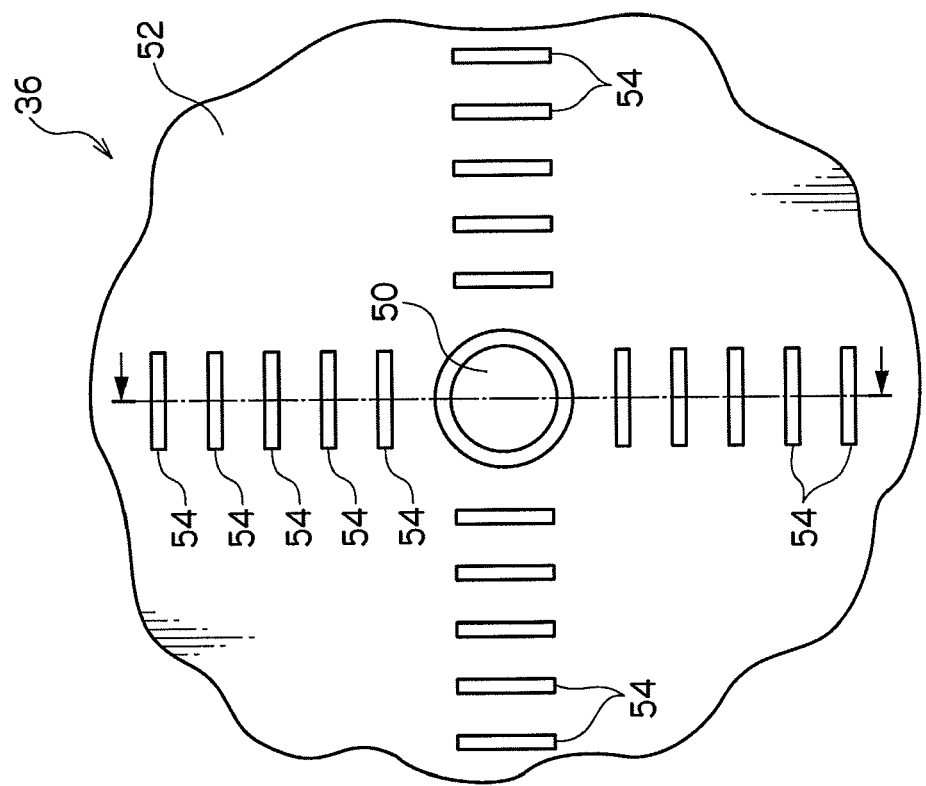

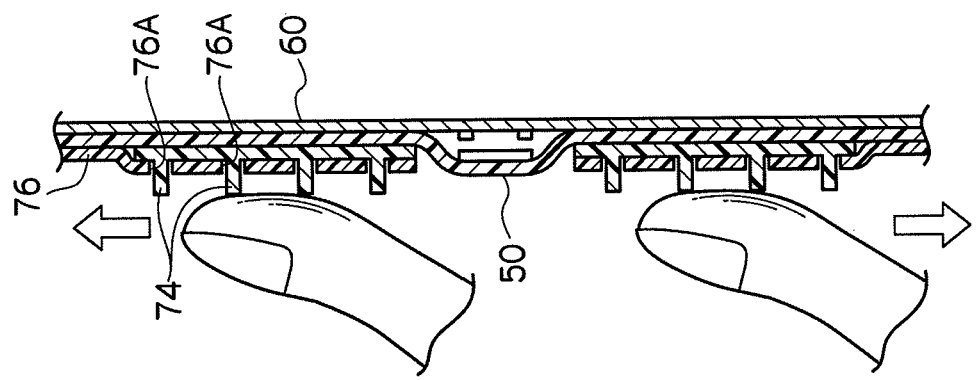
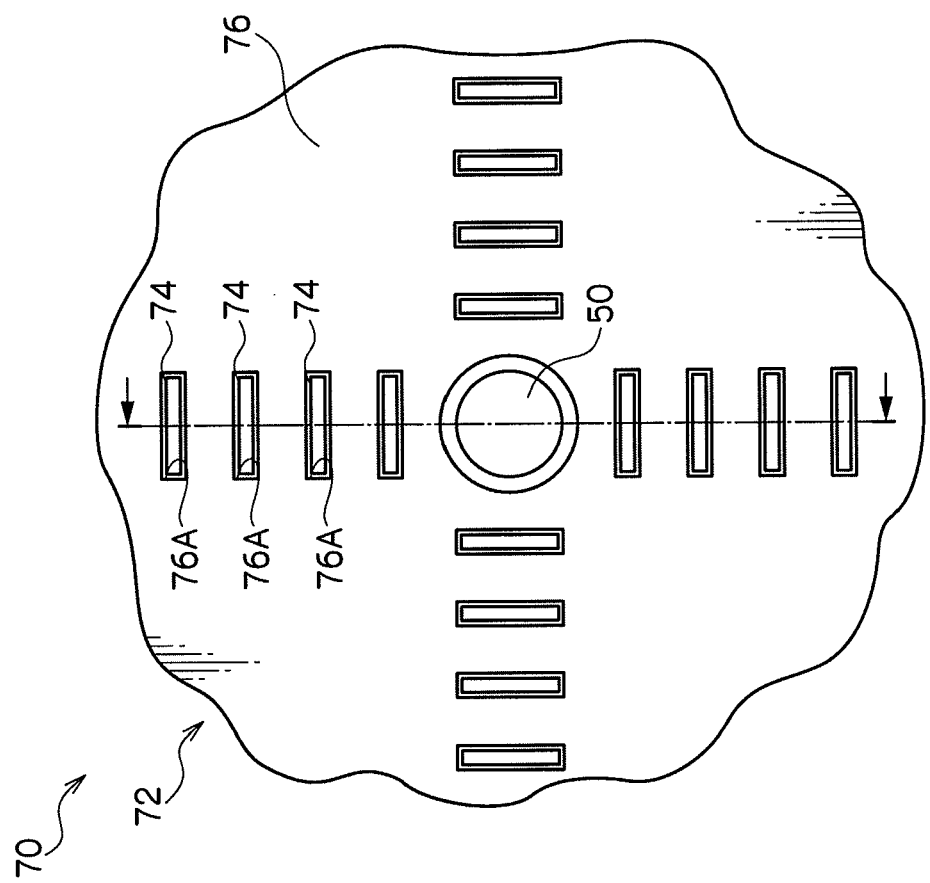

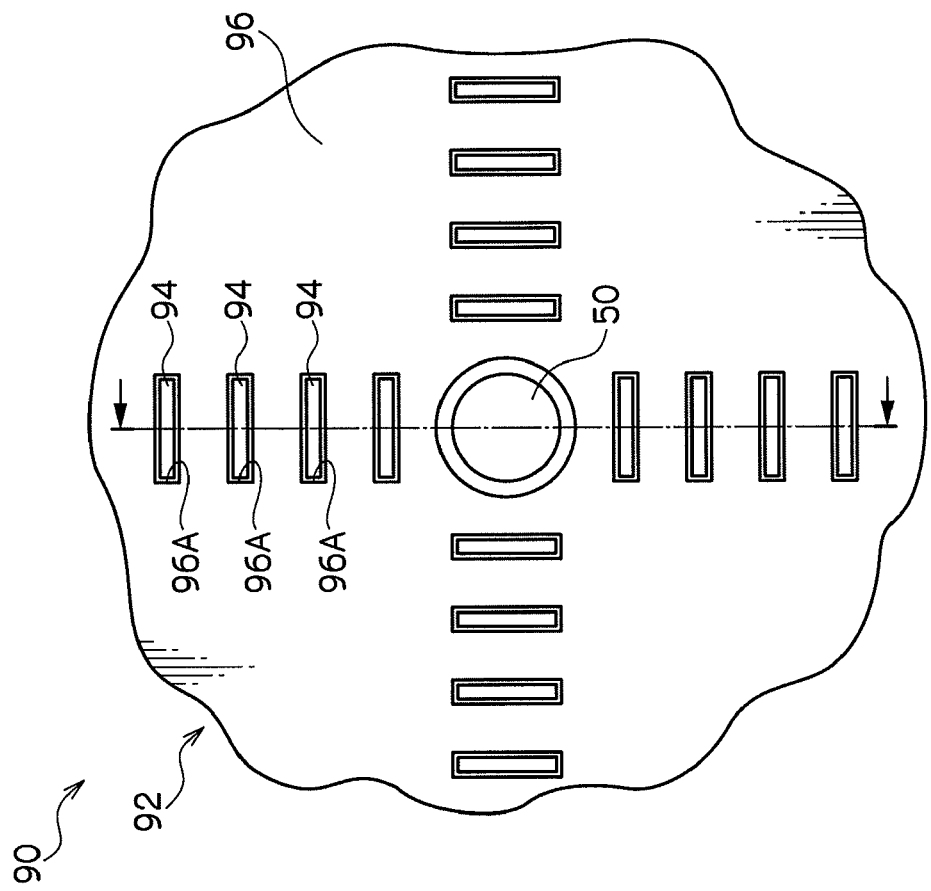
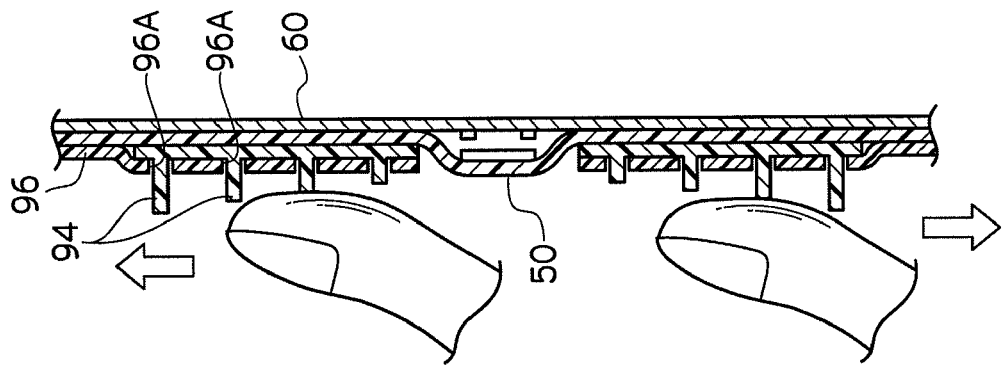
FIG. 6A
FIG. 6B

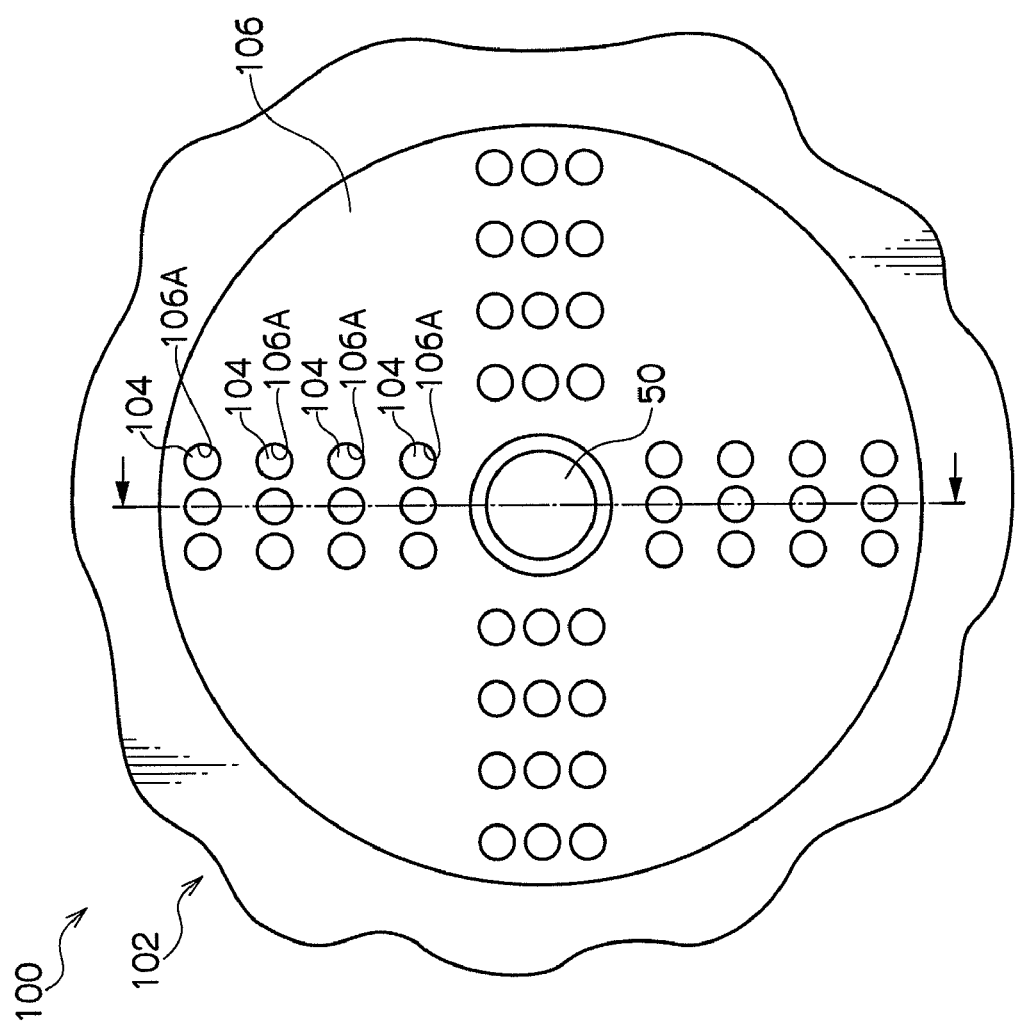
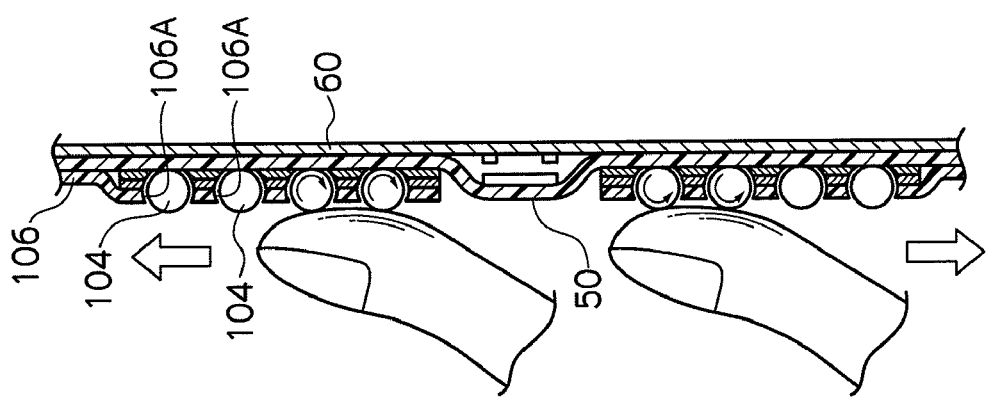
FIG. 7A
FIG. 7B

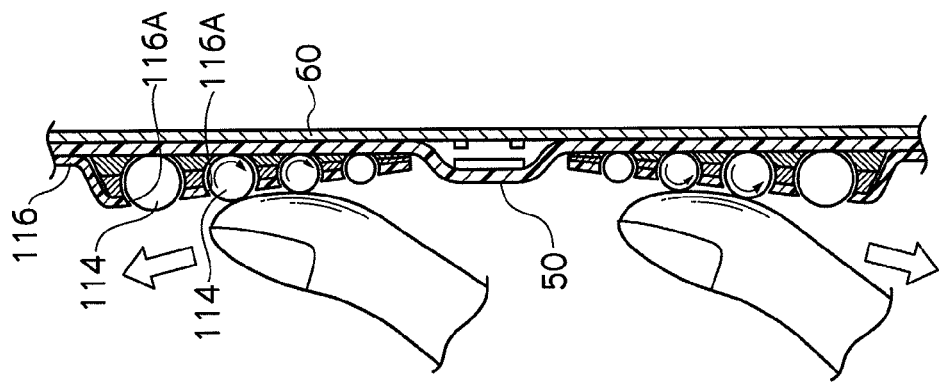
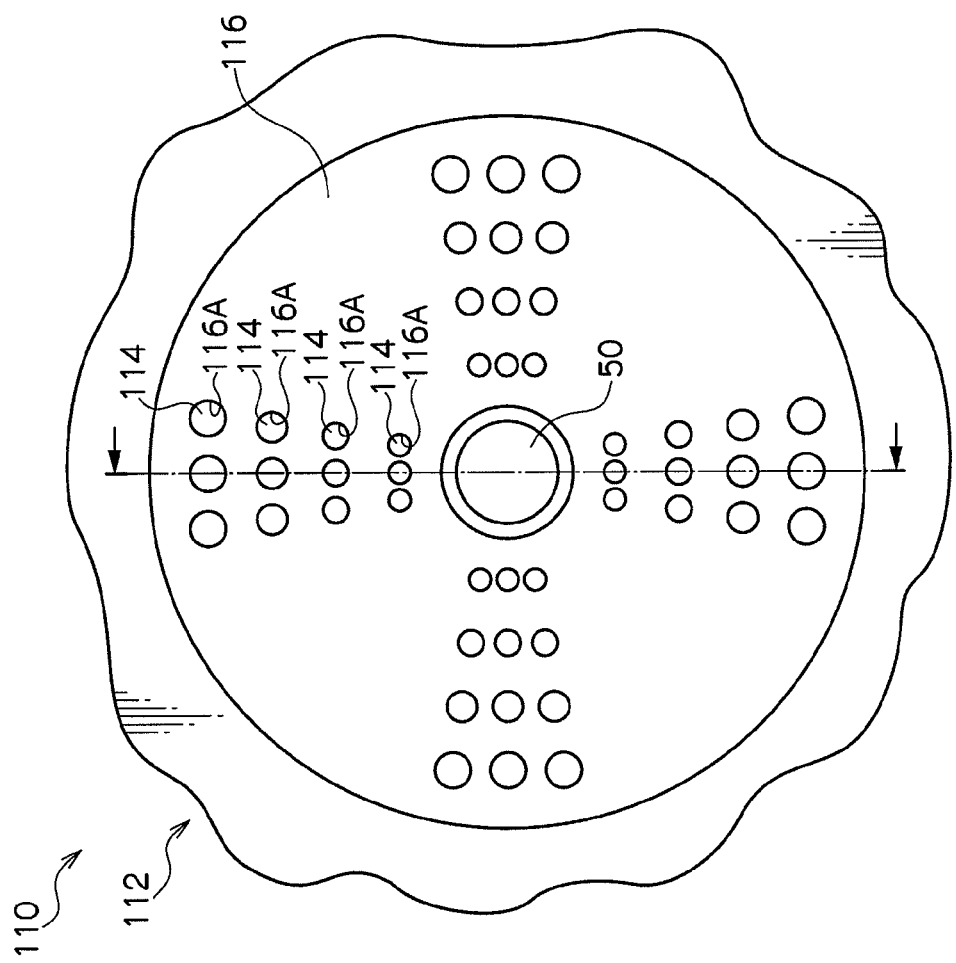

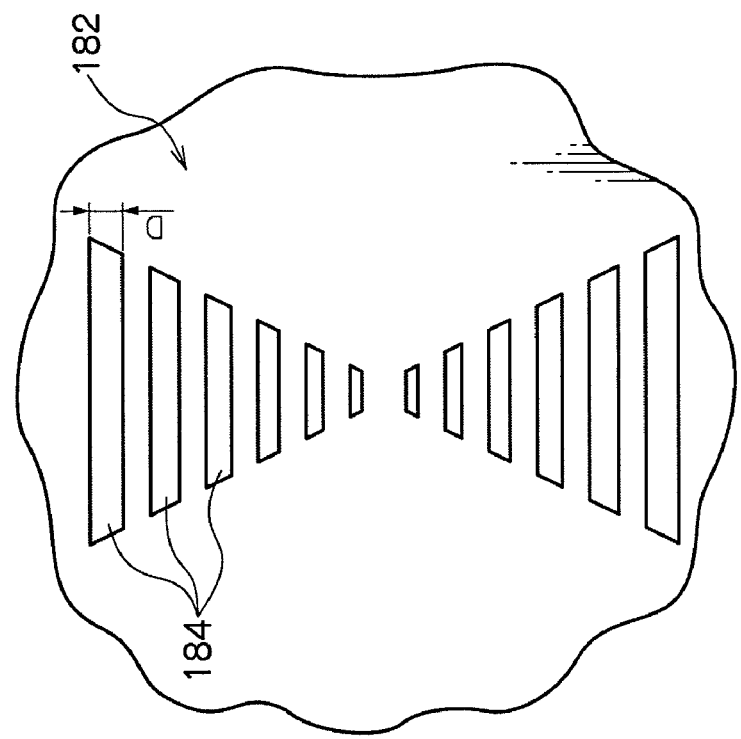
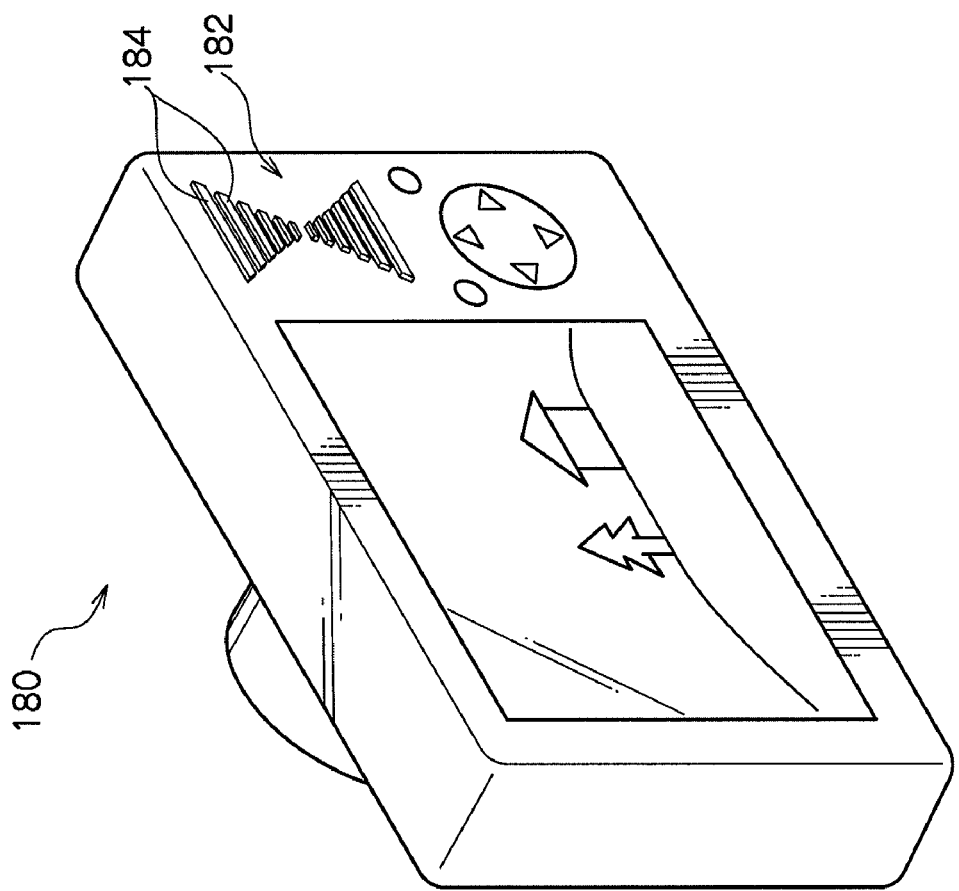

FIG. 17A
FIG. 17B
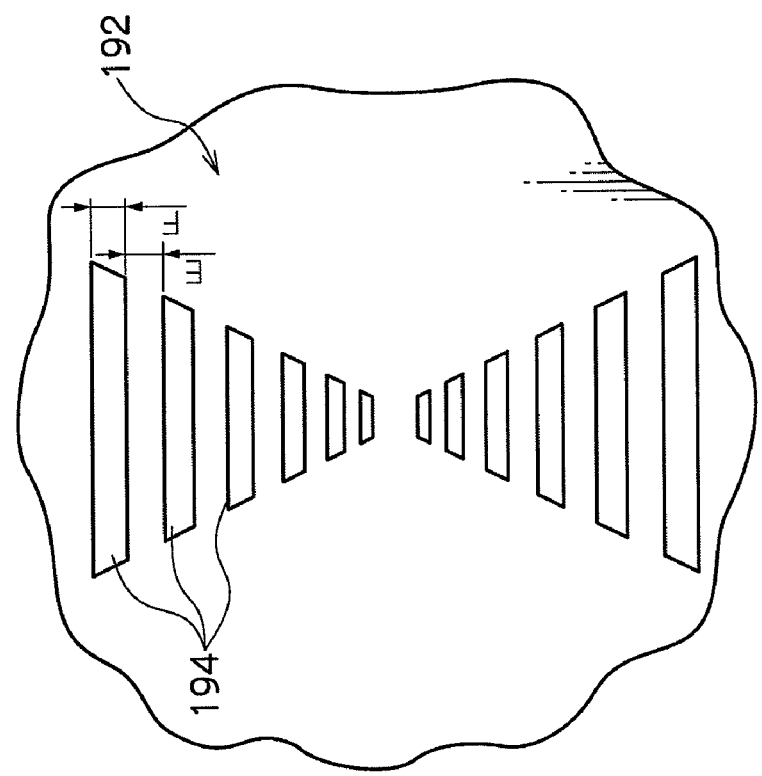
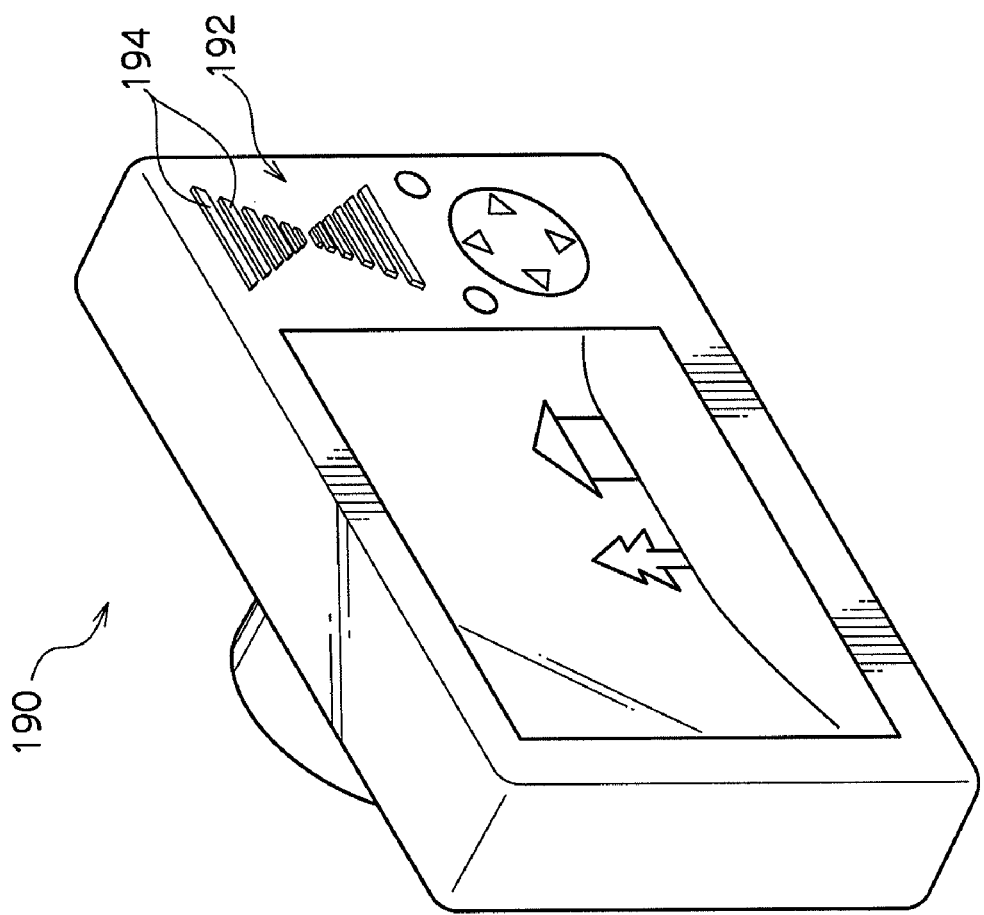

OPERATION APPARATUS AND ELECTRONIC DEVICE EQUIPPED THEREWITH

CROSS-REFERENCE TO RELATED APPLICATION

This application claims priority under 35 USC 119 from Japanese Patent Application No. 2008-020729, the disclosure of which is incorporated by reference herein.

BACKGROUND OF THE INVENTION

1. Technical Field

The present invention relates to an operation apparatus and an electronic device equipped therewith.

2. Description of the Related Art

An operation apparatus described in Japanese Patent Application Laid-Open (JP-A) No. 2007-87764 is equipped with a plurality of protruding operation keys. Letters, digits and the like are embossed in protruding forms at the respective operation keys.

Therefore, a user may push required operation keys from a direction orthogonal to a board without looking at the operation keys.

SUMMARY

However, when a plurality of menu items are shown arranged in a vertical column on a screen of an electronic device, if a menu item is to be selected using such an operation apparatus, an operation key corresponding to the required menu item must be pushed. If an operation key is mistakenly pushed, then the required operation key must be pressed to correct the mistake.

An object of the present invention is selection of a required menu item from a plurality of menu items without several pushes of operation keys.

An operation apparatus relating to a first aspect of the present invention includes: a detection portion that detects a position that a finger touches; and an operation resistance portion that is provided adjacent to the detection portion, the operation resistance portion causing resistance when a finger is slid over the operation resistance portion, which resistance varies.

According to the structure described above, when a finger is slid on the operation resistance portion provided at the operation apparatus, the detection portion detects a position at which the finger is slid.

For example, during operation of an electronic device, when a required menu item is to be selected from a plurality of menu items indicated at the electronic device using the operation apparatus, a user selects the required menu item by sliding a finger while touching the operation resistance portion and stopping the fingertip at a location that corresponds to the required menu item.

At this time, the user senses changes in resistance at the fingertip while sliding the finger, and stops the fingertip at the required position.

Thus, the user may ascertain a movement direction of the fingertip by sensing the variations of resistance at the fingertip and may select the required menu item from the plurality of menu items without several pushes of operation keys.

An operation apparatus according to a second aspect of the present invention is an operation apparatus of the first aspect in which the operation resistance portion includes a plurality of resistance parts arranged in a row in a direction in which the finger is slid.

According to the structure described above, the operation resistance portion has a plurality of resistance parts arranged side by side in the direction in which a finger is to be slid.

Thus, a user may slide a finger in a required direction without looking at the resistance parts, by sliding the finger in the direction of arrangement of the resistance parts, and may select a required menu item from a plurality of menu items.

An operation apparatus according to a third aspect of the present invention is an operation apparatus of the second aspect in which pitches between the plurality of resistance parts vary along the direction in which the finger is slid.

According to the structure described above, the pitches between the resistance parts vary in the direction in which a finger is to be slid.

For example, if an image pictured on a screen of an electronic device is to be enlarged or reduced during operation of the electronic device, operational feel may be improved by matching a proportional change of the displayed image with a proportional change in the pitches of the resistance portions.

An operation apparatus according to a fourth aspect of the present invention is an operation apparatus of the second aspect or the third aspect in which lengths of the plurality of resistance parts in the direction in which the finger is slid vary.

According to the structure described above, lengths, in the direction in which a finger is to be slid, of the plural resistance parts vary.

For example, if an image pictured on a screen of an electronic device is to be enlarged or reduced during operation of the electronic device, operational feel may be improved by matching a proportional change of the displayed image with a proportional change in the lengths of the resistance portions.

An operation apparatus according to a fifth aspect of the present invention is an operation apparatus of the second aspect, third aspect or fourth aspect in which lengths of the plurality of resistance parts in a direction orthogonal to the direction in which the finger is slid vary.

According to the structure described above, the lengths, in the direction orthogonal to the direction in which a finger is to be slid, of the resistance parts vary.

For example, during operation of an electronic device, when a required menu item is to be selected from a plurality of menu items indicated at the electronic device using the operation apparatus, widths of the resistance portions may be sensed with a fingertip thereby a distance may be sensed with a fingertip while the menu item is being selected, and consequently the required menu item may be selected with ease.

An operation apparatus according to a sixth aspect of the present invention is an operation apparatus of any of the first to fifth aspects in which the operation resistance portion is provided in a cross shape.

According to the structure described above, the operation resistance portion is provided in a cross shape.

For example, during operation of an electronic device, when a required menu item is to be selected from a plurality of menu items pictured on a screen of the electronic device using the operation apparatus, if the pictured menu items are arrayed vertically and horizontally, the required menu item may be selected with ease by a user moving a finger while feeling the operation resistance portion, which spreads out in the four directions of the cross shape, with the fingertip.

An operation apparatus according to a seventh aspect of the present invention is an operation apparatus of any of the first to fifth aspects in which the operation resistance portion is provided in an L shape.

For example, during operation of an electronic device, when a required menu item is to be selected from a plurality of menu items pictured on a screen of the electronic device using the operation apparatus, if the pictured menu items are arrayed vertically and horizontally, the required menu item may be selected with ease by a user moving a finger while feeling the operation resistance portion, which spreads out vertically and horizontally in the L shape, with the fingertip.

An operation apparatus according to an eighth aspect of the present invention is an operation apparatus of any of the second to seventh aspects in which the resistance parts are higher in friction resistance than a surface provided around the resistance parts.

According to the structure described above, the friction resistance of the resistance parts is higher than that of the surface provided around the resistance parts. Thus, when a fingertip is moved, a user may select a required menu item with ease while sensing the friction resistance of the resistance portions.

An operation apparatus according to a ninth aspect of the present invention is an operation apparatus of any of the first to seventh aspects, further including a region that is adjacent to the operation resistance portion and is higher in friction resistance than the operation resistance portion.

According to the structure described above, the friction resistance of the region neighboring the operation resistance portion is higher than the friction resistance of the operation resistance portion. Thus, a user may, when moving a fingertip, select a required menu item with ease by sensing the difference between the friction resistances of the operation resistance portion and the adjacent region.

An operation apparatus according to a tenth aspect of the present invention is an operation apparatus of any of the second to ninth aspects in which the resistance parts include protrusion portions that protrude from a surface provided around the resistance parts.

According to the structure described above, the resistance parts are protrusion portions which protrude from the surface provided around the resistance parts. Thus, when a fingertip is moved, a required menu item may be selected with ease while a feeling of projection of the protrusion portions is sensed.

An operation apparatus according to an eleventh aspect of the present invention is an operation apparatus of the tenth aspect in which the protrusion portions are formed with resiliently deformable resilient members.

According to the structure described above, the protrusion portions are formed with resiliently deformable resilient members. Therefore, the protrusion portions deform when a user's finger touches the protrusion portions.

Thus, because deformation of the protrusion portions is sensed with the fingertip while the hand is moved, a required menu item may be selected with ease.

An operation apparatus according to a twelfth aspect of the present invention is an operation apparatus of the tenth aspect in which the protrusion portions include spherical ball members that revolve on the detection portion.

According to the structure described above, the protrusion portions are spherical ball members that roll on the detection portion. Thus, a user may select a required menu item with ease while sensing rolling of the ball members.

An operation apparatus according to a thirteenth aspect of the present invention is an operation apparatus of the tenth aspect, eleventh aspect or twelfth aspect in which heights of the protrusion portions vary along the direction in which the finger is slid.

According to the structure described above, heights of the protrusion portions vary in the direction in which a finger is to be slid. Thus, because the heights of the protrusion portions touched by a fingertip change, the user may ascertain which direction the fingertip is being moved and which protrusion portion the fingertip is touching. Accordingly, a required menu item may be selected with ease.

An electronic device according to a fourteenth aspect of the present invention includes an operation apparatus of any of the first to thirteenth aspects.

According to the structure described above, the electronic device is provided with the operation apparatus of one of the first to thirteenth aspects. Therefore, when a menu item of the electronic device is being selected, the required menu item may be selected with ease using this operation apparatus.

According to the present invention, a required menu item may be selected from a plurality of menu items without several pushes of operation keys.

BRIEF DESCRIPTION OF THE DRAWINGS

Embodiments of the present invention will be described in detail based on the following figures, wherein:

FIG. 2A is a plan view of the operation apparatus relating to the first exemplary embodiment of the present invention;

FIG. 2B is a sectional view of the operation apparatus relating to the first exemplary embodiment of the present invention;

FIG. 4A is a plan view of an operation apparatus relating to a second exemplary embodiment of the present invention;

FIG. 4B is a sectional view of the operation apparatus relating to the second exemplary embodiment of the present invention;

FIG. 6A is a plan view of an operation apparatus relating to a fourth exemplary embodiment of the present invention;

FIG. 6B is a sectional view of the operation apparatus relating to the fourth exemplary embodiment of the present invention;

FIG. 7A is a plan view of an operation apparatus relating to a fifth exemplary embodiment of the present invention;

FIG. 7B is a sectional view of the operation apparatus relating to the fifth exemplary embodiment of the present invention;

FIG. 8A is a plan view of an operation apparatus relating to a sixth exemplary embodiment of the present invention;

FIG. 8B is a sectional view of the operation apparatus relating to the sixth exemplary embodiment of the present invention;

FIG. 16A is a perspective view of a digital camera employing an operation apparatus relating to a thirteenth exemplary embodiment of the present invention;

FIG. 16B is a plan view of the operation apparatus relating to the thirteenth exemplary embodiment of the present invention;

FIG. 17A is a perspective view of a digital camera employing an operation apparatus relating to a fourteenth exemplary embodiment of the present invention; and FIG. 17B is a plan view of the operation apparatus relating to the fourteenth exemplary embodiment of the present invention.

DETAILED DESCRIPTION OF THE INVENTION

A portable telephone 10 employing an operation apparatus 36 relating to a first exemplary embodiment will be described in association with FIG. 1 to FIG. 3.

Figure 3B:
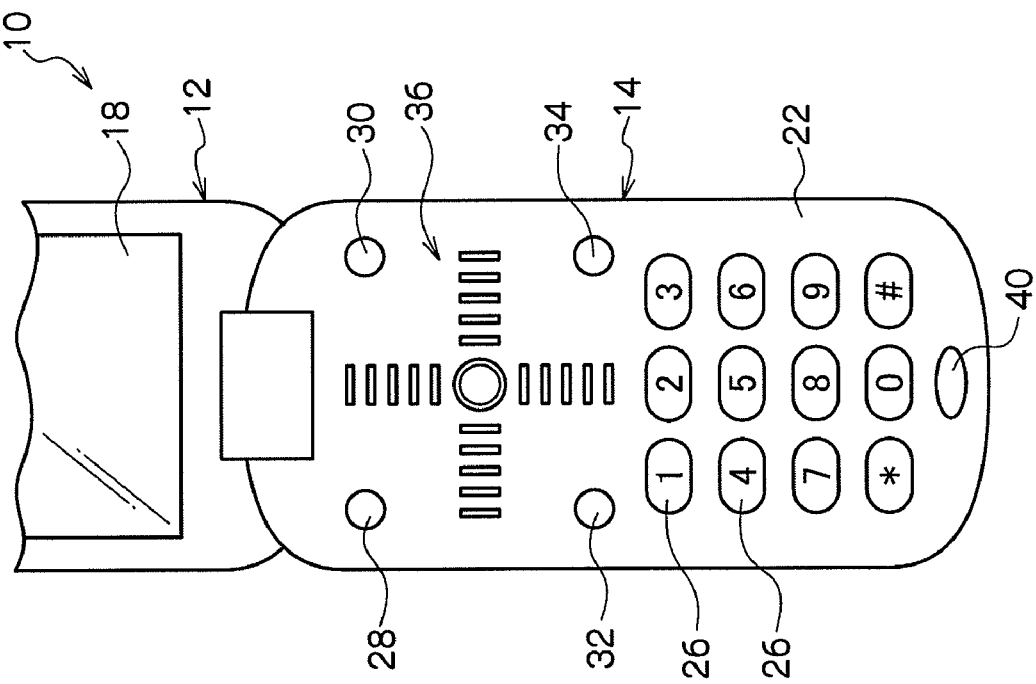
FIG. 3B is a plan view of the portable telephone employing the operation apparatus relating to the first exemplary embodiment of the present invention.
Figure 3A:
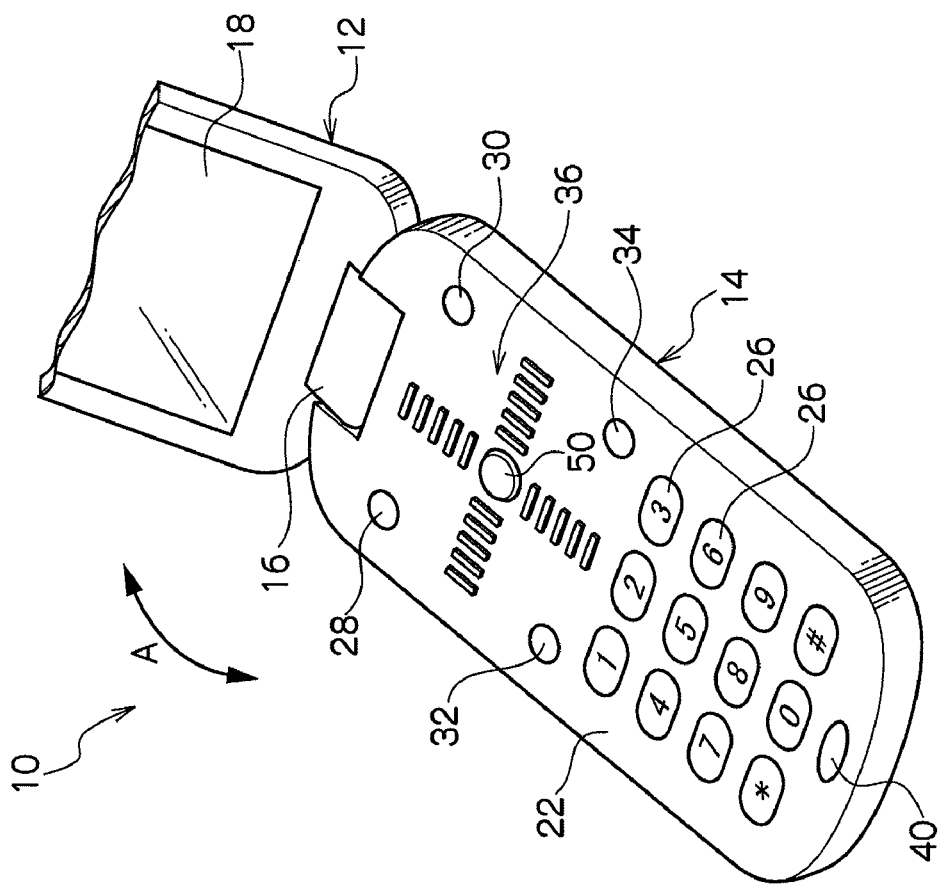
FIG. 3A is a perspective view of the portable telephone employing the operation apparatus relating to the first exemplary embodiment of the present invention.

As is shown in FIG. 3A and FIG. 3B, two casings, a first casing 12 and a second casing, of the portable telephone 10, which is an electronic device, are joined by a hinge portion 16 to be turnable in the direction of arrow A in the drawings (see FIG. 3A). That is, the portable telephone 10 is structured as a folding-type portable telephone.

Figure 1:
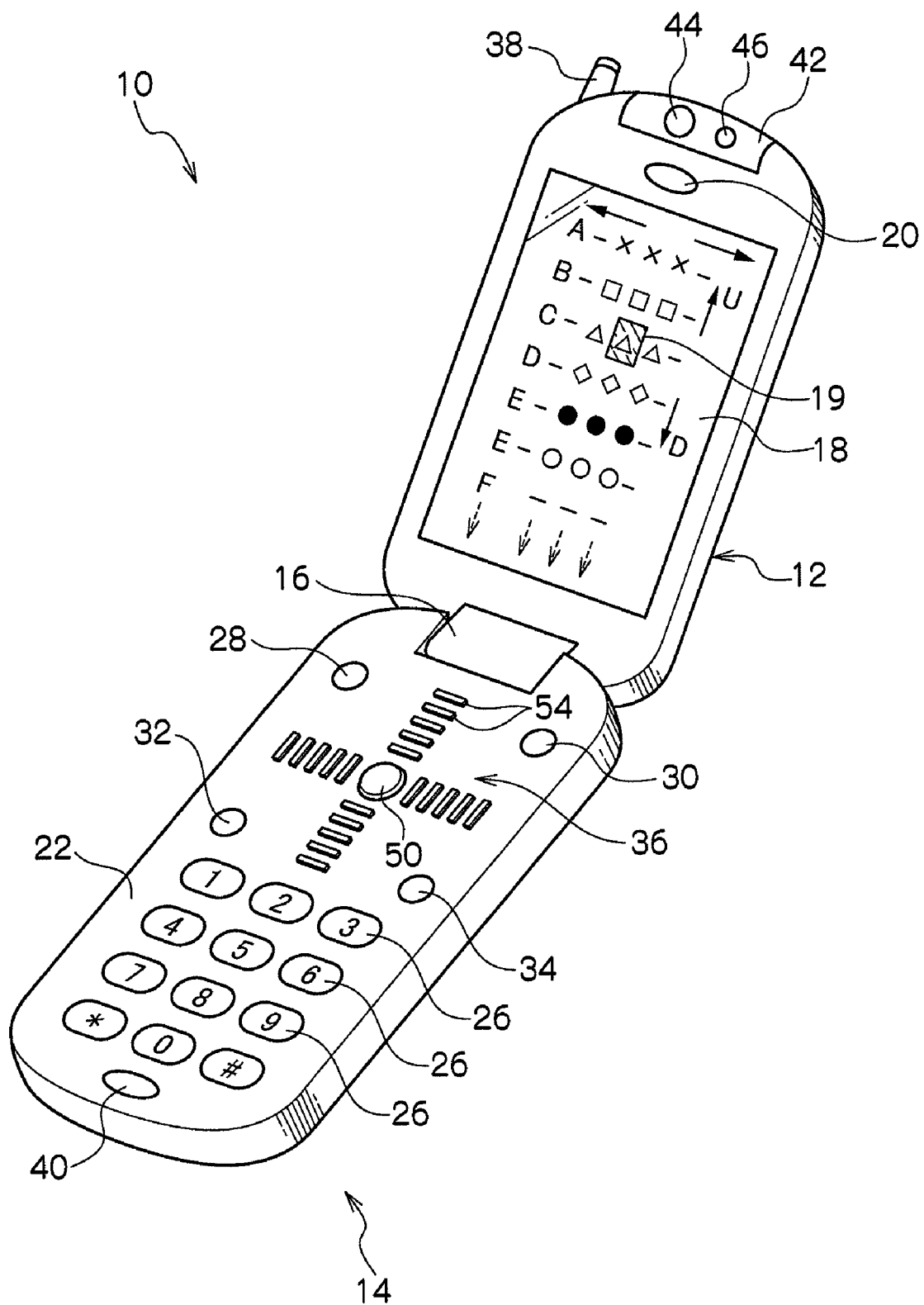
FIG. 1 is a perspective view of a portable telephone at which an operation apparatus relating to a first exemplary embodiment of the present invention is employed.

The first casing 12 is provided with a liquid crystal screen 18 and a speaker 20 (see FIG. 1). The liquid crystal screen 18 is for displaying various kinds of information such as menu screens, messages and the like. The speaker 20 principally plays sounds associated with telephony. The liquid crystal screen 18 is visible in a state in which the first casing 12 and the second casing 14 are opened out, and is covered and protected by the second casing 14 in a state in which the first casing 12 and the second casing 14 are closed up (a folded state).

In the liquid crystal screen 18 relating to the present exemplary embodiment, a parallax barrier is provided between a liquid crystal display portion and a backlight. In the parallax barrier, plural shading portions, which partially block light from the backlight, are provided at predetermined intervals. The parallax barrier is constituted with a switching liquid crystal, and the shading portions can be switched between light blocking and light transmission by switching on and off. As a result, displays of three-dimensional images and displays of usual images are enabled. When a three-dimensional image is being displayed at the liquid crystal screen 18, light is locally dispersed by the parallax barrier being switched on, and a left eye image and a right eye image are sent to left and right eyes, respectively.

As shown in FIG. 1, an antenna 38 is extensibly provided at the first casing 12. The antenna 38 is for exchanging various kinds of information with the outside world by wireless. A user of the portable telephone 10 extends/collapses the antenna 38 in accordance with need.

Character keys 26, a mode button 28, a cancel button 30, an off-hook button 32, a power switch 34 and the cross-form operation apparatus 36 are provided at an operation face 22 of the second casing 14, which opposes the first casing 12 in the folded state. Respective pluralities of digits, characters, letters and symbols are assigned to the respective character keys 26. The mode button 28 is operated when various modes are being specified and the like. The cancel button 30 is operated when various operation states are to be canceled and the like. The off-hook button 32 is operated when a telephone call is to be made or the like. The power switch 34 switches a power supply of the portable telephone 10 on and off. The operation apparatus 36 is used for selecting required menu items from pluralities of menu items that are displayed at the liquid crystal screen 18.

Details of the operation apparatus 36 will be described in detail later.

A photography-capable section 42 is provided in a vicinity of an end portion of the first casing 12, which is at an opposite end of the first casing 12 from the hinge portion 16. The photography-capable section 42 is provided with a lens 44 for imaging a subject image. The photography-capable section 42 is provided to be turnable relative to the first casing 12 in the same direction as the direction of turning according to the hinge portion 16.

The photography-capable section 42 is also provided with a light 46 for illuminating light at a subject. The light 46 is mounted at the photography-capable section 42 so as to be capable of illuminating light in the same direction as a photography direction of the lens 44. Thus, even when the photography-capable section 42 is turned and the photography direction is altered, the light 46 can always illuminate light in the photography direction.

A microphone 40 is provided at the second casing 14. The microphone 40 is principally for inputting voice sounds associated with telephony.

Principal Structures

Next, the cross-form operation apparatus 36 will be described.

As shown in FIG. 2A, a circular confirm button 50, which is pushable, is provided in the operation apparatus 36. Protrusion portions 54 protrude from a board 52 so as to spread in four directions from the confirm button 50. The protrusion portions 54 are arranged side by side from one end portion (an end portion at the side at which the confirm button 50 is disposed) toward another end portion.

As shown in FIG. 2B, the protrusion portions 54 are formed on the board 52 by printing, and an electrostatic capacitance-type sensor 60 is provided at a rear face side of the board 52 (an opposite side thereof from the side at which the protrusion portions 54 are disposed). The electrostatic capacitance-type sensor 60 serves as a detection portion that sequentially detects the protrusion portions 54 that are touched when the protrusion portions 54 are touched from the one end portion toward the other end portion or from the other end portion toward the one end portion.

As shown in FIG. 1, a user presses the power switch 34 and the portable telephone 10 operates. Further, when the mode button 28 is pressed, a plurality of mode menu items are displayed at the liquid crystal screen 18.

Accordingly, if the protrusion portions 54 of the operation apparatus 36 are touched with a fingertip while the fingertip is moving, as shown in FIG. 2B, then this is detected by the electrostatic capacitance-type sensor 60, and a selection frame 19 for selecting a menu item displayed on the mode button 28 of FIG. 1 moves in accordance with a vertical/horizontal movement direction of the fingertip, via an unillustrated control section. Here, a pitch of the protrusion portions 54 is set to be similar to a pitch of the menu items arranged on the screen. That is, in the present exemplary embodiment, the menu items are arranged with equal intervals and accordingly the protrusion portions 54 are arranged with equal intervals.

A menu item is selected by the selection frame 19 reaching the required menu item, and the menu item is confirmed when the confirm button 50 at the middle portion is touched.

Thus, a required menu item may be selected from a plurality of menu items just by moving a finger while touching the protrusion portions 54, without several pushes of operation keys.

Moreover, a selection frame may be moved in a required direction by a fingertip being slid along the direction of a row of the protrusion portions 54 without the operation apparatus 36 being looked at.

Because the pitch of the protrusion portions 54 and the pitch of the menu items arranged on the screen are set to be similar, movement amounts of the selection frame can be perceived by sensation in the fingertip.

Furthermore, an inexpensive structure may be formed, because of the protrusion portions 54 being formed by printing.

The present invention has been described for a particular exemplary embodiment, but the present invention is not limited to this exemplary embodiment. It will be apparent to a person skilled in the art that many other embodiments are possible within the scope of the present invention. For example, in the above exemplary embodiment, the protrusion portions 54 are disposed to spread in four directions, but they may be disposed in a straight line or the like.

Further, in the above exemplary embodiment, a user ascertains a movement direction and/or movement distance by the fingertip of the user touching the protrusion portions 54. However, the user may perceive the movement direction and the like of the fingertip by areas with a higher friction resistance being arranged in a row on the board.

In the above exemplary embodiment, the portable telephone 10 serves as an example of an electronic device has been described, but an electronic device may be another kind of electrical equipment, such as a digital camera, a video camera, a remote control, a portable terminal, a keyboard or the like.

In the above exemplary embodiment, the electrostatic capacitance-type sensor 60 serves as an example of a detection portion has been described, but a detection portion may be a pressure sensor, a resistance sensor, a light sensor or the like.

Next, a portable telephone 70 employing an operation apparatus 72 of a second exemplary embodiment of the present invention will be described in accordance with FIG. 4A and FIG. 4B.

Here, members the same as in the first exemplary embodiment are assigned the same reference numerals and will not be described.

As shown in FIG. 4A and FIG. 4B, in this exemplary embodiment, differently from the first exemplary embodiment, protrusion portions 74 are provided so as to protrude from rectangular aperture portions 76A formed in a board 76.

Thus, a material of the protrusion portions 74 may be made different from the material of the board 76, and a material with a better feel may be selected for the protrusion portions 74.

Moreover, differently from a case of forming the protrusion portions by printing, respective heights of the protrusion portions 74 may be set according with requirements.

Next, a portable telephone 80 employing an operation apparatus 82 of a third exemplary embodiment of the present invention will be described in accordance with FIG. 5A and FIG. 5B.

Here, members the same as in the second exemplary embodiment are assigned the same reference numerals and will not be described.

Figure 5B:
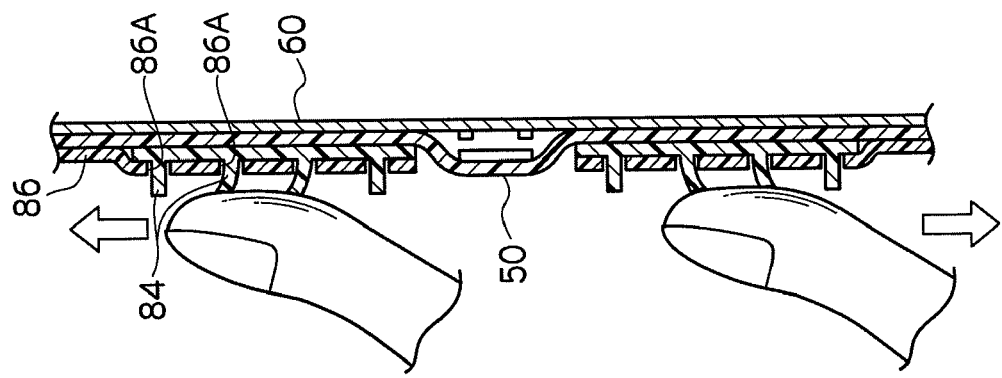
FIG. 5B is a sectional view of the operation apparatus relating to the third exemplary embodiment of the present invention.
Figure 5A:
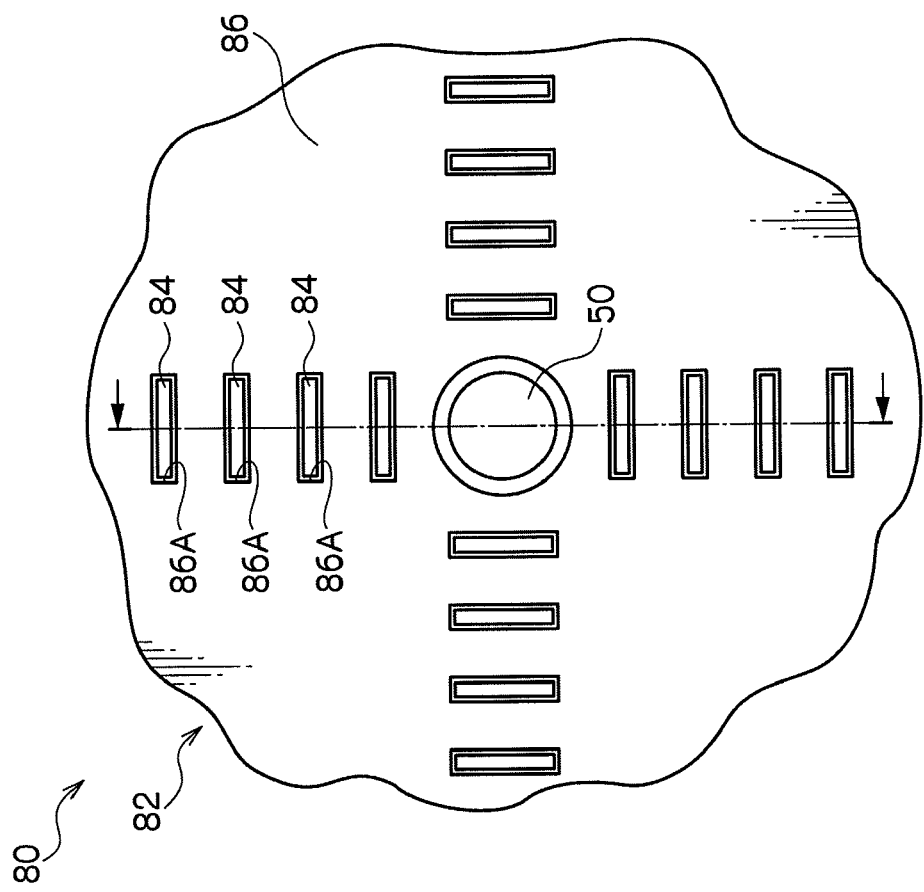
FIG. 5A is a plan view of an operation apparatus relating to a third exemplary embodiment of the present invention.

As shown in FIG. 5A and FIG. 5B, in this exemplary embodiment, differently from the second exemplary embodiment, protrusion portions 84 are formed of a material that resiliently deforms when touched.

Thus, because the protrusion portions 84 are formed by resilient members, a sensation that a fingertip receives from the protrusion portions 84 may be improved.

Next, a portable telephone 90 employing an operation apparatus 92 of a fourth exemplary embodiment of the present invention will be described in accordance with FIG. 6A and FIG. 6B.

Here, members the same as in the second exemplary embodiment are assigned the same reference numerals and will not be described.

As shown in FIG. 6A and FIG. 6B, in this exemplary embodiment, differently from the second exemplary embodiment, heights of protrusion portions 94 get higher away from the confirm button 50 toward outer sides.

Thus, because the heights of the protrusion portions 94 change in accordance with a movement direction of a fingertip, the user may easily perceive the movement direction of the fingertip.

Next, a portable telephone 100 employing an operation apparatus 102 of a fifth exemplary embodiment of the present invention will be described in accordance with FIG. 7A and FIG. 7B.

Here, members the same as in the second exemplary embodiment are assigned the same reference numerals and will not be described.

As shown in FIG. 7A and FIG. 7B, in this exemplary embodiment, differently from the second exemplary embodiment, spherical ball members 104 are provided protruding from aperture portions 106A in a board 106.

Specifically, around a third of each of the ball members 104 are exposed from the board 106, and the ball members 104 are retained to be revolvable in position.

That is, the ball members 104 revolve when a fingertip is moved. Therefore, the user may select a required menu item while sensing the revolving of the ball members 104, without looking at the ball members 104.

Next, a portable telephone 110 employing an operation apparatus 112 of a sixth exemplary embodiment of the present invention will be described in accordance with FIG. 8A and FIG. 8B.

Here, members the same as in the fifth exemplary embodiment are assigned the same reference numerals and will not be described.

As shown in FIG. 8A and FIG. 8B, in this exemplary embodiment, differently from the fifth exemplary embodiment, spherical ball members 114 are provided protruding from aperture portions 116A in a board 116, and sizes of the ball members 114 get larger away from the confirm button 50 toward outer sides.

Thus, because the sizes of the ball members 114 change in accordance with a movement direction of a fingertip, the user may easily perceive the movement direction of the fingertip.

Next, a portable telephone 120 employing an operation apparatus 122 of a seventh exemplary embodiment of the present invention will be described in accordance with FIG. 9A and FIG. 9B.

Here, members the same as in the first exemplary embodiment are assigned the same reference numerals and will not be described.

Figure 9B:
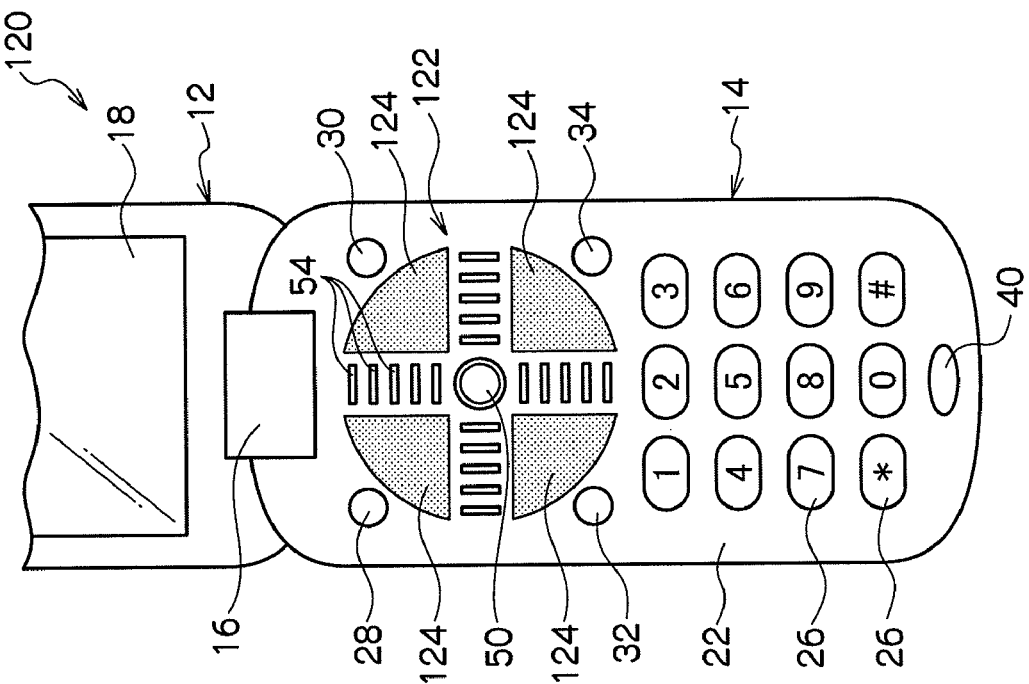
FIG. 9B is a plan view of the portable telephone employing the operation apparatus relating to the seventh exemplary embodiment of the present invention.
Figure 9A:
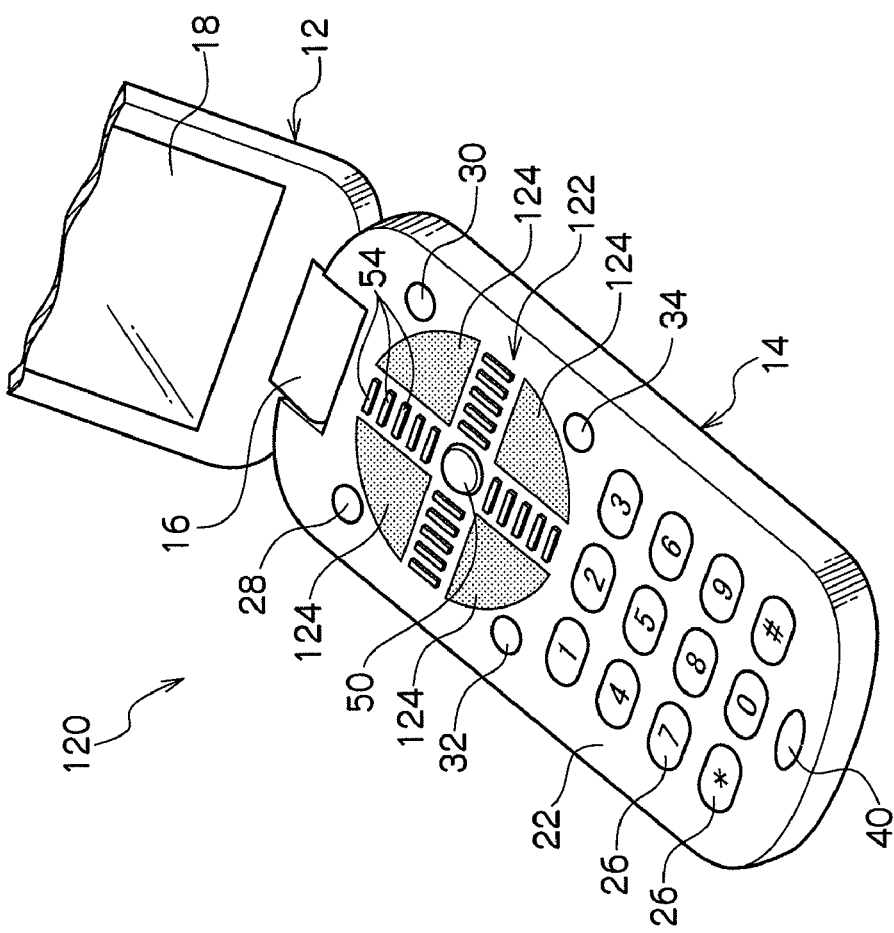
FIG. 9A is a perspective view of a portable telephone employing an operation apparatus relating to a seventh exemplary embodiment of the present invention.

As shown in FIG. 9A and FIG. 9B, in this exemplary embodiment, differently from the first exemplary embodiment, fan-shaped friction resistance portions 124 are provided between the respective protrusion portions 54 extending in the four directions.

Specifically, each of the fan-shaped friction resistance portions 124 features two straight lines extending along the directions of the rows of protrusion portions 54 as radial portions, and a friction resistance of the friction resistance portions 124 is higher than other areas including the protrusion portions 54. Thus, when a user touches an edge of the friction resistance portions 124, the user may easily ascertain the direction in which the protrusion portions 54 are arranged.

Next, a portable telephone 130 employing an operation apparatus 132 of an eighth exemplary embodiment of the present invention will be described in accordance with FIG. 10A and FIG. 10B.

Here, members the same as in the seventh exemplary embodiment are assigned the same reference numerals and will not be described.

Figure 10B:
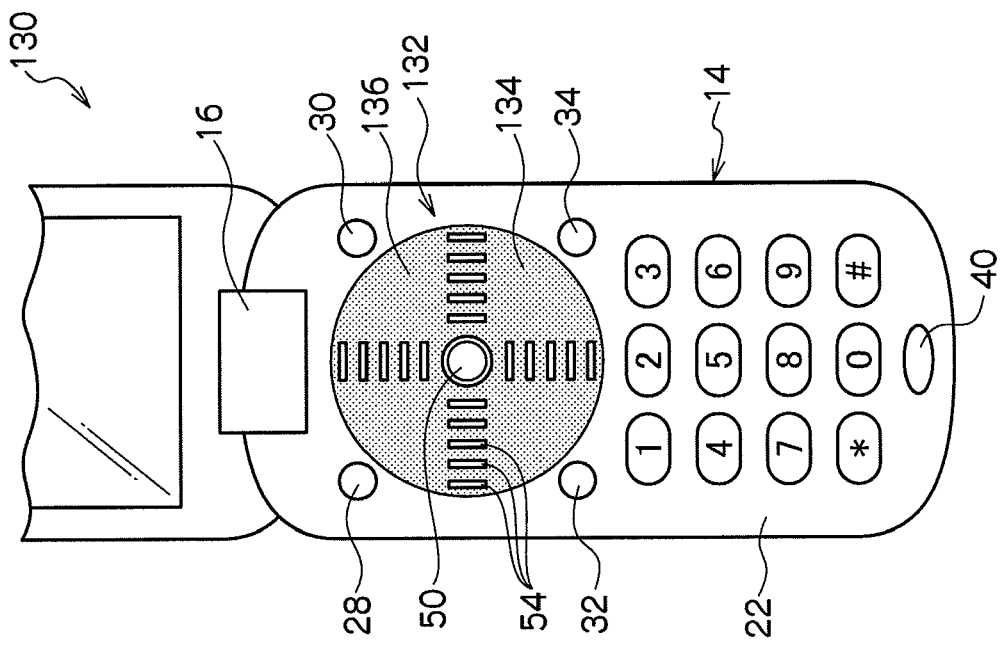
FIG. 10B is a plan view of the portable telephone employing the operation apparatus relating to the eighth exemplary embodiment of the present invention.
Figure 10A:
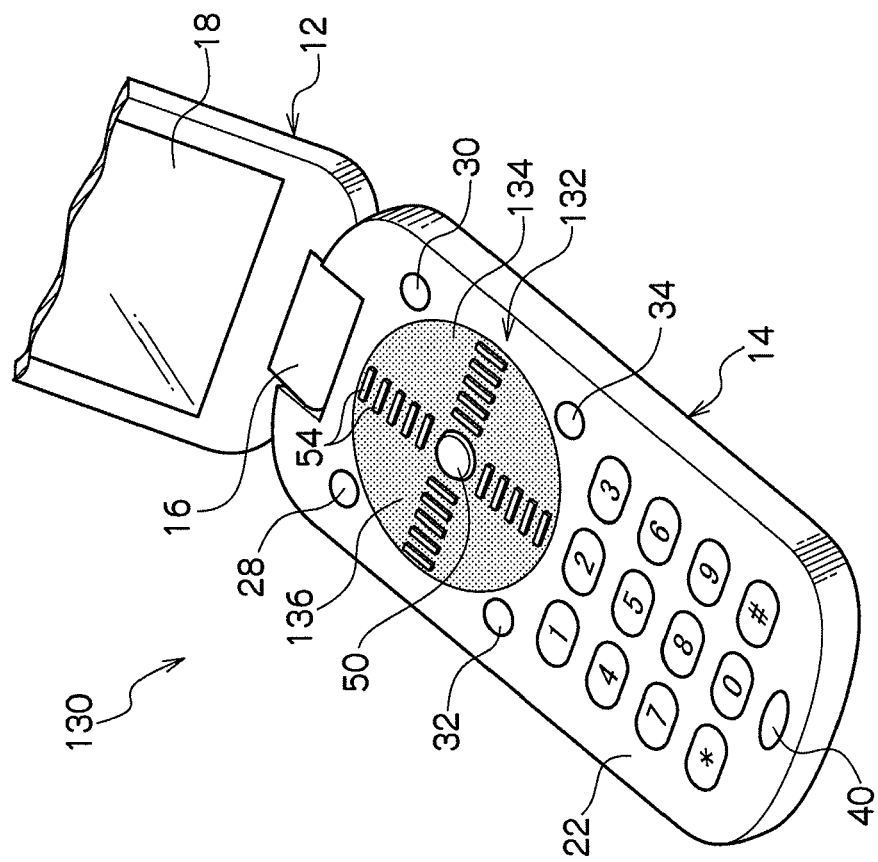
FIG. 10A is a perspective view of a portable telephone employing an operation apparatus relating to an eighth exemplary embodiment of the present invention.

As shown in FIG. 10A and FIG. 10B, in this exemplary embodiment, differently from the seventh exemplary embodiment, a friction resistance portion 134 is provided on a board 136 so as to surround the protrusion portions 54.

Thus, because the protrusion portions 54 with low friction resistance are protruded from the friction resistance portion 134 with high friction resistance, a user may perceive positions of the protrusion portions 54 with ease by sensations at a fingertip.

Next, a portable telephone 140 employing an operation apparatus 142 of a ninth exemplary embodiment of the present invention will be described in accordance with FIG. 11A and FIG. 11B.

Here, members the same as in the first exemplary embodiment are assigned the same reference numerals and will not be described.

Figure 11B:
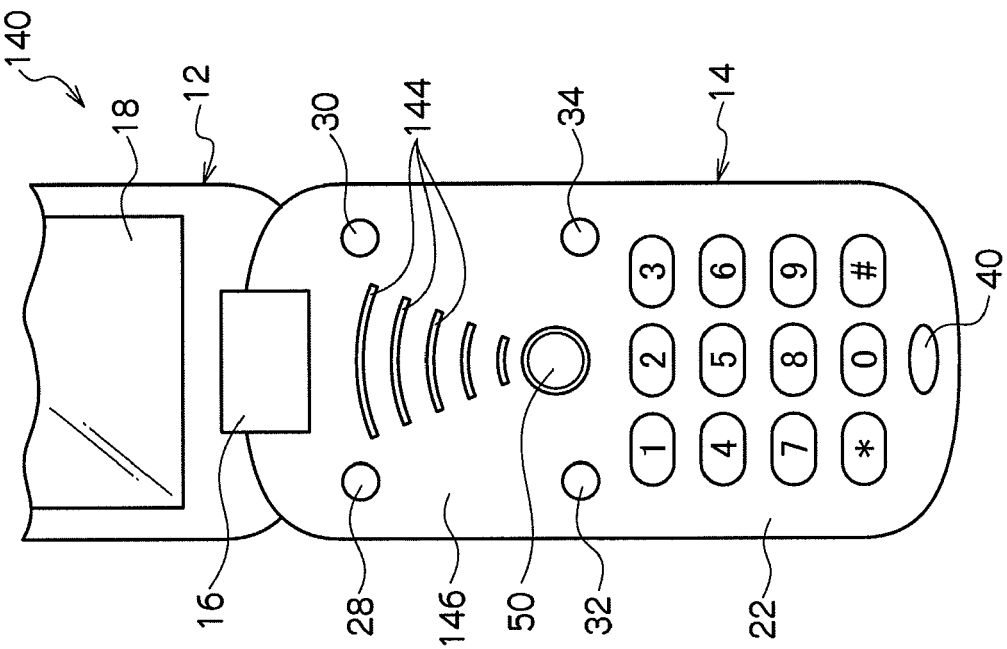
FIG. 11B is a plan view of the portable telephone employing the operation apparatus relating to the ninth exemplary embodiment of the present invention.
Figure 11A:
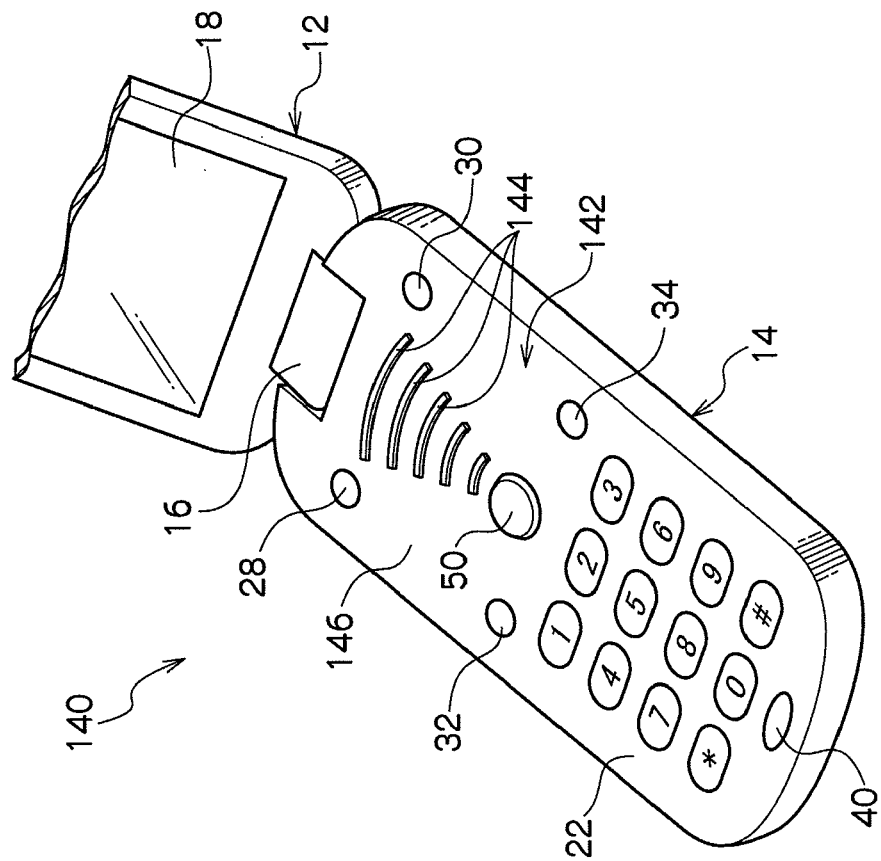
FIG. 11A is a perspective view of a portable telephone employing an operation apparatus relating to a ninth exemplary embodiment of the present invention.

As shown in FIG. 11A and FIG. 11B, in this exemplary embodiment, differently from the first exemplary embodiment, protrusion portions 144 are provided so as to be arranged in a row from the confirm button 50 toward the hinge portion 16.

Specifically, the protrusion portions 144 are formed in circular arc shapes and are formed with lengths of the arcs that are further away from the confirm button 50 being longer.

Thus, because the lengths of the arcs change, a user may perceive which of the protrusion portions 144 a finger is touching without looking at the protrusion portions 144. Accordingly, the user may easily perceive the movement direction of the fingertip.

Next, a portable telephone 150 employing an operation apparatus 152 of a tenth exemplary embodiment of the present invention will be described in accordance with FIG. 12A and FIG. 12B.

Here, members the same as in the ninth exemplary embodiment are assigned the same reference numerals and will not be described.

Figure 12B:
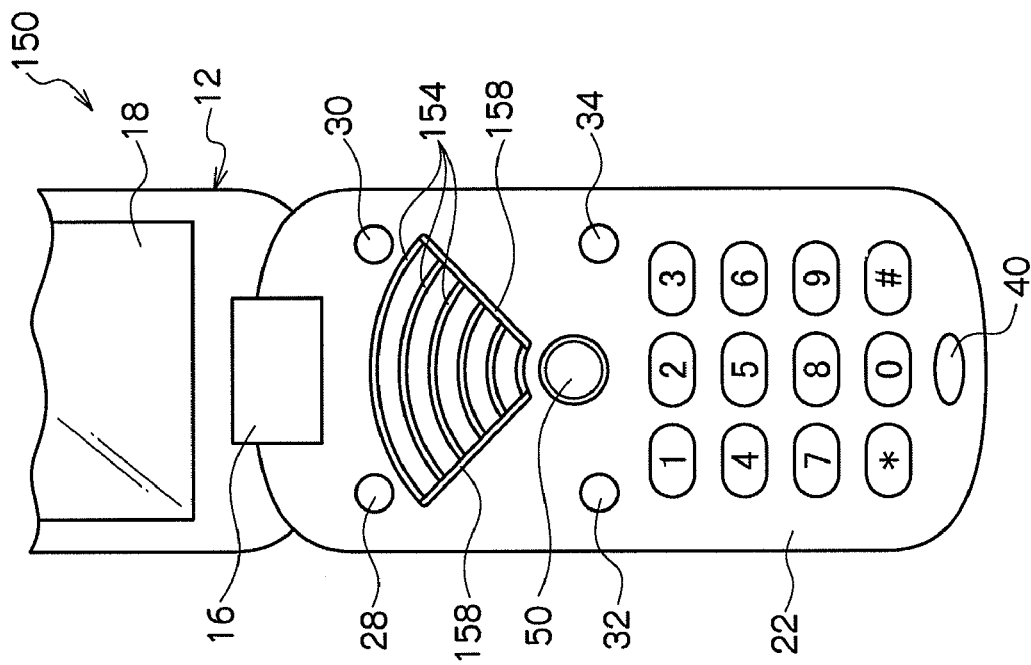
FIG. 12B is a plan view of the portable telephone employing the operation apparatus relating to the tenth exemplary embodiment of the present invention.
Figure 12A:
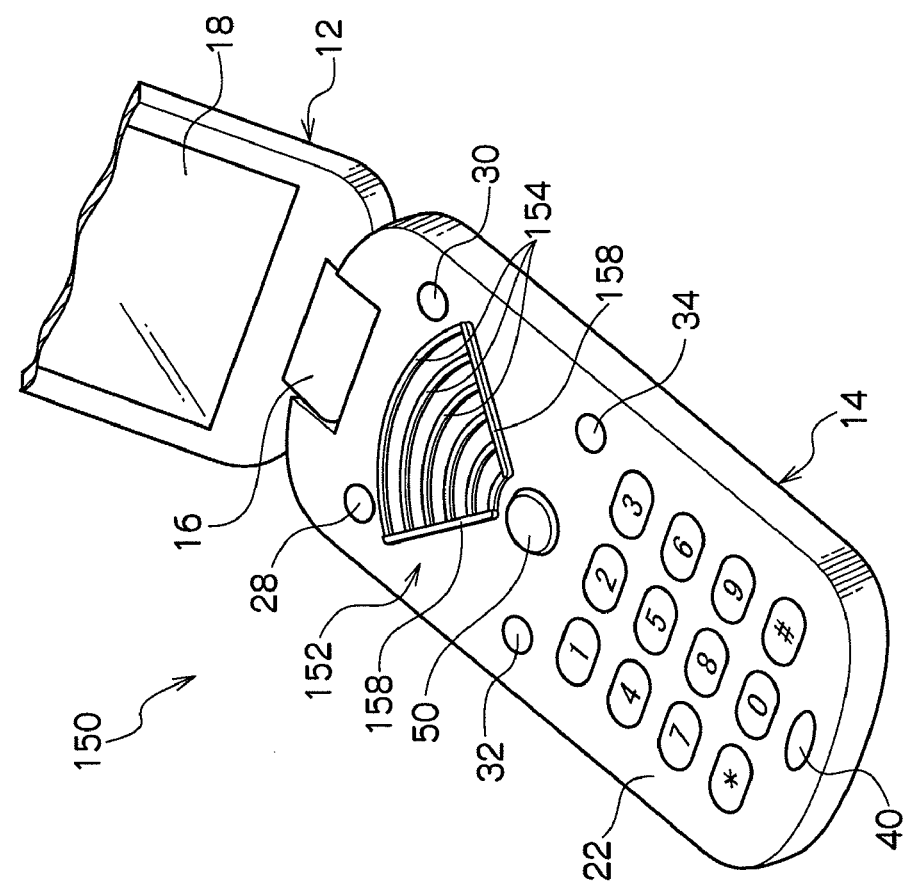
FIG. 12A is a perspective view of a portable telephone employing an operation apparatus relating to a tenth exemplary embodiment of the present invention.

As shown in FIG. 12A and FIG. 12B, in this exemplary embodiment, differently from the ninth exemplary embodiment, circular arc-form protrusion portions 154 are arranged in a row, and protrusion edge portions 158 are provided, which link respective end portions of the protrusion portions 154.

Thus, the protrusion edge portions 158 may guide the finger of a user in an operation direction.

Moreover, because the protrusion edge portions 158 may serve as start points and end points, the user may move the finger along a circular arc from one end to the other end. In this manner, the size of a movement range of the finger may be selected by the user in accordance with the length of a circular arc, and a distance of movement of a menu frame may be controlled.

Next, a portable telephone 160 employing an operation apparatus 162 of an eleventh exemplary embodiment of the present invention will be described in accordance with FIG. 13A and FIG. 13B.

Here, members the same as in the first exemplary embodiment are assigned the same reference numerals and will not be described.

Figure 13A:
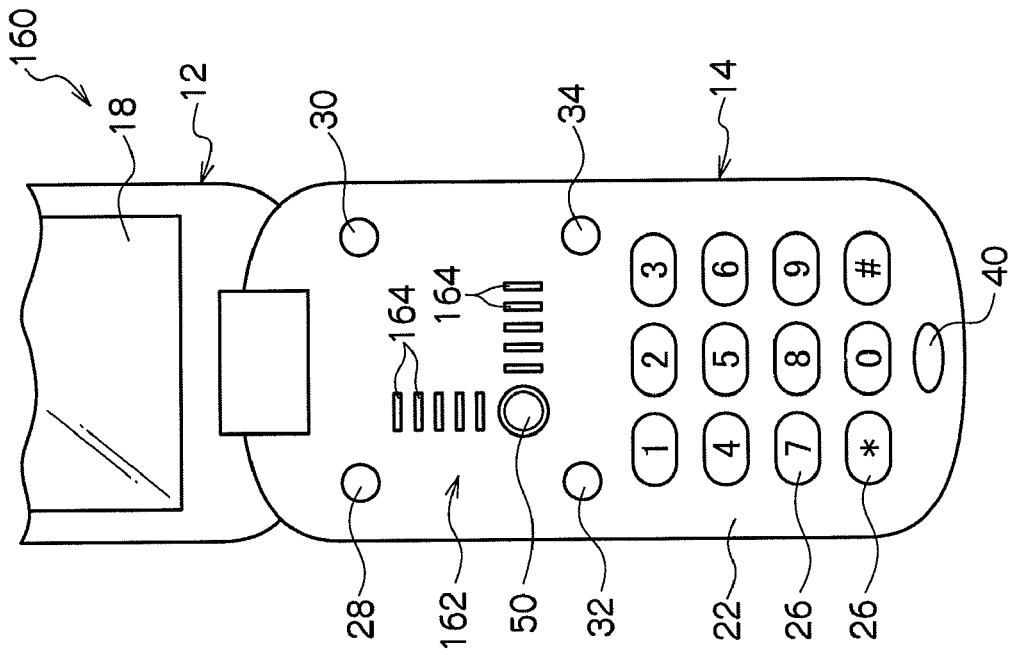
FIG. 13A is a perspective view of a portable telephone employing an operation apparatus relating to an eleventh exemplary embodiment of the present invention.
Figure 13B:
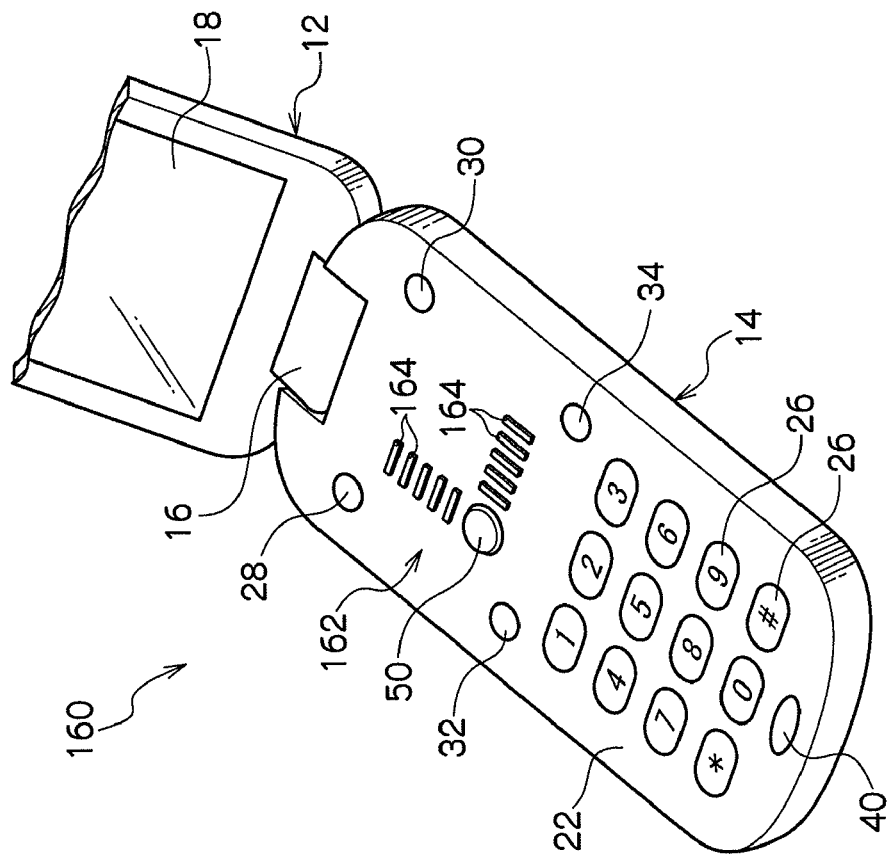
FIG. 13B is a plan view of the portable telephone employing the operation apparatus relating to the eleventh exemplary embodiment of the present invention.

As shown in FIG. 13A and FIG. 13B, in this exemplary embodiment, differently from the first exemplary embodiment, protrusion portions 164 are arranged in an L shape.

Because of this L-shaped arrangement, a menu item selection frame may be moved in an L shape.

Next, a digital camera 170 employing an operation apparatus 172 of a twelfth exemplary embodiment of the present invention, will be described in accordance with FIG. 14A to FIG. 15B.

Here, members the same as in the first exemplary embodiment are assigned the same reference numerals and will not be described.

Figure 15B:
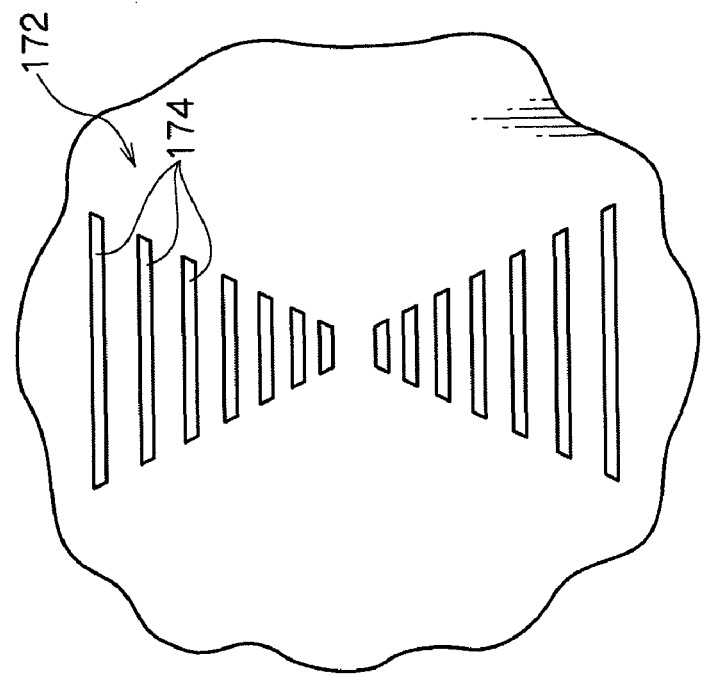
FIG. 15B is a plan view of the operation apparatus relating to the twelfth exemplary embodiment of the present invention.
Figure 15A:
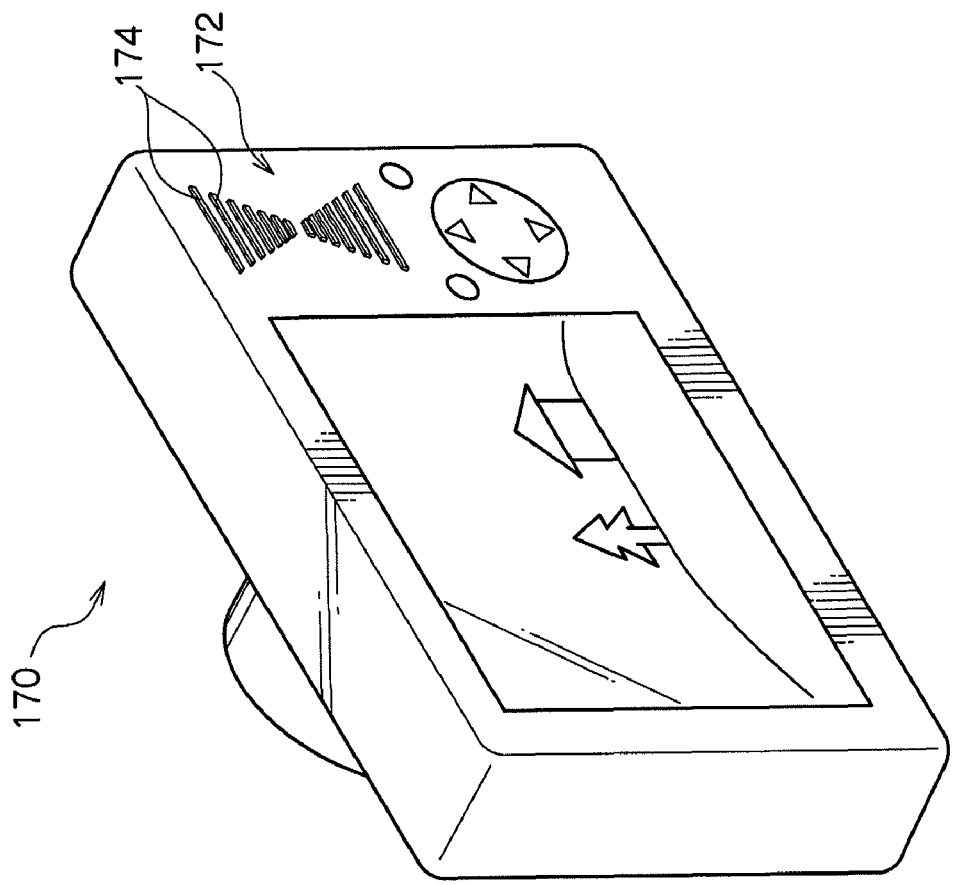
FIG. 15A is a perspective view of the digital camera employing the operation apparatus relating to the twelfth exemplary embodiment of the present invention.

As shown in FIG. 15A and FIG. 15B, in this exemplary embodiment, differently from the first exemplary embodiment, the operation apparatus 172 is used as a zoom switch of the digital camera 170.

Specifically, when a subject is being photographed, the operation apparatus 172 is used for moving an unillustrated lens via a control section and enlarging or reducing a subject image. Protrusion portions 174 of the operation apparatus 172 are arranged in a column in a vertical direction. Widths of the protrusion portions 174 (widths in a direction orthogonal to the direction in which a fingertip is moved) get larger away from a middle portion toward vertical direction limits.

Figure 14C:
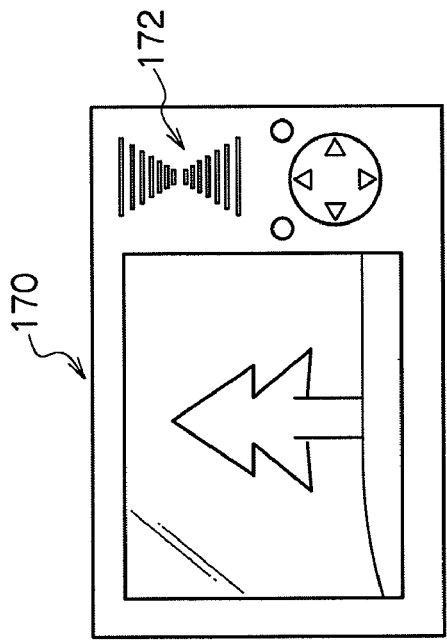
FIG. 14C is a rear view of the digital camera employing the operation apparatus relating to the twelfth exemplary embodiment of the present invention.
Figure 14D:
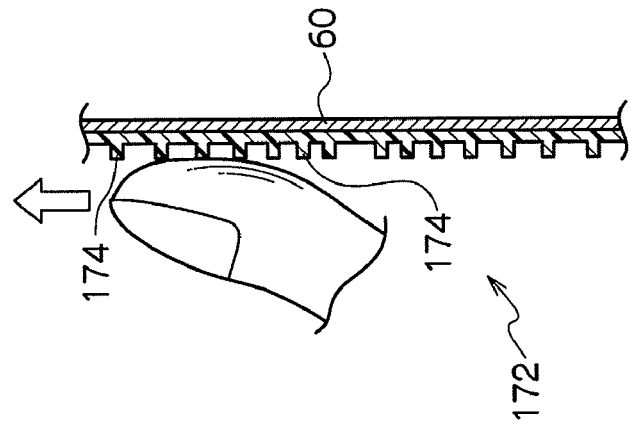
FIG. 14D is a sectional view of the operation apparatus relating to the twelfth exemplary embodiment of the present invention.
Figure 14A:
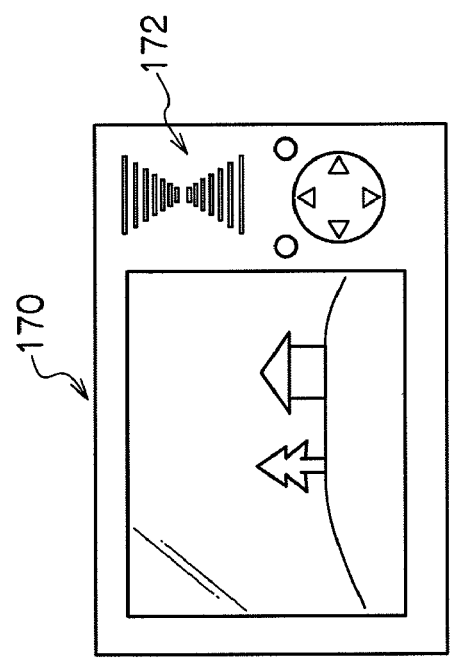
FIG. 14A is a rear view of a digital camera employing an operation apparatus relating to a twelfth exemplary embodiment of the present invention.
Figure 14B:
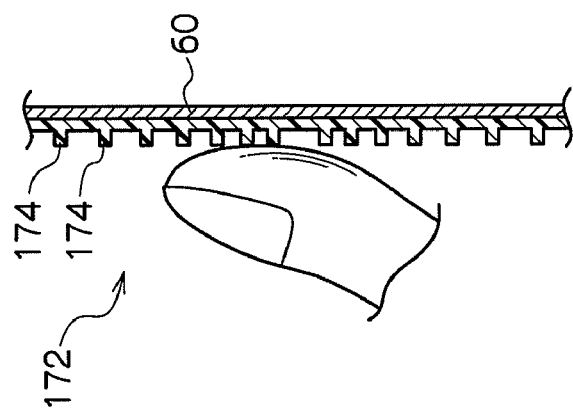
FIG. 14B is a sectional view of the operation apparatus relating to the twelfth exemplary embodiment of the present invention.

With this structure, as shown in FIG. 14A to FIG. 14D, when a fingertip is moved from the position shown in FIG. 14B to the position shown in FIG. 14D, a subject pictured on a display screen is enlarged from that shown in FIG. 14A to that shown in FIG. 14C.

Thus, a subject image may be enlarged or reduced by moving a fingertip vertically.

Next, a digital camera 180 employing an operation apparatus 182 of a thirteenth exemplary embodiment of the present invention, will be described in accordance with FIG. 16A and FIG. 16B.

Here, members the same as in the twelfth exemplary embodiment are assigned the same reference numerals and will not be described.

As shown in FIG. 16A and FIG. 16B, in this exemplary embodiment, differently from the twelfth exemplary embodiment, vertical direction widths of protrusion portions 184 (the dimension D in FIG. 16B) change to upward and downward away from the middle portion.

Proportional changes in enlargement or reduction of a subject image are controlled so as to match proportional changes between widths of the protrusion portions 184.

Thus, because proportional changes in enlargement and reduction of subject images are synchronized with proportional changes between widths of the protrusion portions 184, a user may easily enlarge or reduce a subject image to a size according to requirements.

Next, a digital camera 190 employing an operation apparatus 192 of a fourteenth exemplary embodiment of the present invention, will be described in accordance with FIG. 17A and FIG. 17B.

Here, members the same as in the twelfth exemplary embodiment are assigned the same reference numerals and will not be described.

As shown in FIG. 17A and FIG. 17B, in this exemplary embodiment, differently from the twelfth exemplary embodiment, vertical direction widths of protrusion portions 194 (the dimension F in FIG. 17B) change to upward and downward away from the middle portion. In addition, pitches between the neighboring protrusion portions 194 also change to upward and downward away from the middle portion.

Proportional changes in enlargement or reduction of a subject image are determined in accordance with proportional changes between the widths of the protrusion portions 194 and proportional changes between the pitches between the neighboring protrusion portions 194.

Thus, because proportional changes in enlargement and reduction of subject images are determined in accordance with both the proportional changes between the widths of the protrusion portions 194 and between the pitches between the neighboring protrusions portions 194, a user may easily enlarge or reduce a subject image to a size according to requirements.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. An operation apparatus comprising:
   a detection portion that detects a position that a finger touches; and
   an operation resistance portion that is provided adjacent to the detection portion, the operation resistance portion causing resistance when a finger is slid over the operation resistance portion, which resistance varies.

2. The operation apparatus according to claim 1, wherein the operation resistance portion comprises a plurality of resistance parts arranged in a row in a direction in which the finger is slid.

3. The operation apparatus according to claim 2, wherein pitches between the plurality of resistance parts vary along the direction in which the finger is slid.

4. The operation apparatus according to claim 2, wherein lengths of the plurality of resistance parts in the direction in which the finger is slid vary.

5. The operation apparatus according to claim 2, wherein lengths of the plurality of resistance parts in a direction orthogonal to the direction in which the finger is slid vary.

6. The operation apparatus according to claim 1, wherein the operation resistance portion is provided in a cross shape.

7. The operation apparatus according to claim 1, wherein the operation resistance portion is provided in an L shape.

8. The operation apparatus according to claim 2, wherein the resistance parts are higher in friction resistance than a surface provided around the resistance parts.

9. The operation apparatus according to claim 1, further comprising a region that is adjacent to the operation resistance portion and is higher in friction resistance than the operation resistance portion.

10. The operation apparatus according to claim 2, wherein the resistance parts comprise protrusion portions that protrude from a surface provided around the resistance parts.

11. The operation apparatus according to claim 10, wherein the protrusion portions are formed with resiliently deformable resilient members.

12. The operation apparatus according to claim 10, wherein the protrusion portions include spherical ball members that revolve on the detection portion.

13. The operation apparatus according to claim 10, wherein heights of the protrusion portions vary along the direction in which the finger is slid.

14. An electronic device comprising an operation apparatus according to claim 1.

15. An electronic device comprising an operation apparatus according to claim 10.

* * * * *